United States Patent [19]

Zweifel et al.

[11] 4,367,324
[45] Jan. 4, 1983

[54] PHOTOCROSSLINKABLE POLYMERS WITH THIOXANTHONE AND IMIDYL GROUPINGS IN SIDE CHAINS

[75] Inventors: Hans Zweifel, Basel; Joseph Berger, Marly; Vratislav Kvita, Reinach; Martin Roth, Marly, all of Switzerland

[73] Assignee: Ciba-Geigy Corporation, Ardsley, N.Y.

[21] Appl. No.: 228,817

[22] Filed: Jan. 26, 1981

[30] Foreign Application Priority Data

Feb. 5, 1980 [CH] Switzerland............................ 918/80

[51] Int. Cl.$^3$ .................... C08F 26/06; C08F 28/06
[52] U.S. Cl. .................................. 526/256; 525/282; 525/284; 526/262; 528/322; 430/629; 430/630
[58] Field of Search ............... 526/256, 262; 528/322; 525/282, 284

[56] References Cited

FOREIGN PATENT DOCUMENTS 2811755 9/1978 Fed. Rep. of Germany .
1458185 12/1976 United Kingdom .

OTHER PUBLICATIONS

Cols. 1-2, 35-36, USP 3,306,875, Hay.
English Language Translation of Japanese Patent Application Publication 4631731, Sep., 1971.

*Primary Examiner*—Harold D. Anderson
*Attorney, Agent, or Firm*—Harry Falber

[57] ABSTRACT

Photocrosslinkable polymers which have a mean molecular weight of not less than 5,000 and contain, in side chains, thioxanthone groupings of the formula

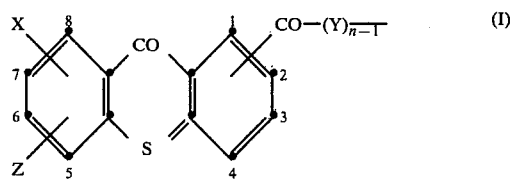

and, in side chains, imidyl groupings of the formula

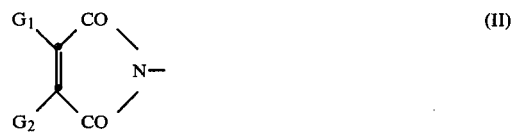

in which X, Y, Z, n, $G_1$ and $G_2$ are as defined in the patent claim, are suitable for the production of highly light-sensitive image materials, for the production of printing plates for the offset printing process and in particular as so-called photoresists for the production of printed circuits. The thioxanthone groupings (I) act as sensitizers for the photocrosslinkable groups of the polymer, so that it is not necessary to add further sensitizers.

12 Claims, No Drawings

PHOTOCROSSLINKABLE POLYMERS WITH THIOXANTHONE AND IMIDYL GROUPINGS IN SIDE CHAINS

The present invention relates to novel photocrosslinkable polymers with thioxanthone and imidyl groupings in side chains and processes for their preparation.

It is known that free or halogenated, especially chlorinated, thioxanthones are suitable as sensitisers for photo-induced crosslinking reactions. The prerequisite for a successful application of this type is good compatibility of the sensitiser in the polymer, i.e. miscibility of the sensitiser with the polymer must be such that elevated concentrations can be obtained. Furthermore, the sensitisers must be readily soluble in the solvents used when processing the polymers. The known thioxanthones which have been mentioned do not meet these requirements in every respect; in particular they easily separate out from the mixture in the polymer, as a result of which the sensitiser effect of the polymer is impaired.

Novel photocrosslinkable polymers have now been found which have a mean molecular weight of not less than 5,000 and contain, in side chains, thioxanthone groupings of the formula I

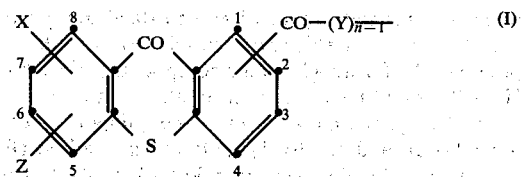

and, in side chains, imidyl groupings of the formula II

in which $G_1$ and $G_2$ independently of one another are alkyl having 1–4 C atoms or together are unsubstituted or methyl-substituted trimethylene or tetramethylene, n is the number 1 or 2, X is hydrogen, halogen, —CN, —NO$_2$, phenylsulfonyl or alkylsulfonyl, alkyl, alkoxy, alkylthio, N,N-dialkylamino or —CO-alkyl having, in each case, 1–4 C atoms in the alkyl moieties, Z is hydrogen, halogen or alkyl, alkoxy, alkythio or N,N-dialkylamino having, in each case, 1–4 C atoms in the alkyl moieties, Y is —OR$_1$—, —SR$_1$— or —N(R$_2$)R$_1$—, and the hetero-atom of the radical Y is bonded to the —CO— group, R$_1$ is straightchain or branched alkylene having a total of 2–23 C atoms and 2–13 C atoms in the main chain, cyclopentylene, cyclohexylene, phenylene or

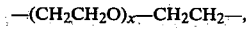
—(CH$_2$CH$_2$O)$_x$—CH$_2$CH$_2$—,

R$_2$ is hydrogen or straight-chain or branched alkyl having a total of 1–23 C atoms and 1–13 C atoms in the main chain, x is an integer from 1 to 5, the proportion of groupings of the formula I being 0.1 to 50 percent and the proportion of groupings of the formula II being 5–99.9 percent, based on the number of recurring structural elements in the polymer.

Preferably, the proportion of groupings of the formula I is 0.1 to 30 percent and the proportion of groupings of the formula II is 10 to 99.9 percent, based on the number of recurring structural elements in the polymer. Particularly preferentially, the proportion of groupings of the formula I is 0.1 to 10 percent and the proportion of groupings of the formula II is 30 to 99.9 percent, based on the number of recurring structural elements in the polymer. The polymers according to the invention advantageously have a mean molecular weight of 5,000 to about 1,000,000 and in particular a mean molecular weight of about 10,000 to 1,000,000. The mean molecular weight is determined by methods known per se, for example by determining the light scatter or by gel permeation chromatography.

The polymers according to the invention are, for example, polyethers, polyamines, polyimines, polycondensation products based on phenol-formaldehyde, polysaccharides, gelatines and, in particular, polymers which are obtained by homopolymerisation or copolymerisation of monomers containing C=C double bonds.

The polymers according to the invention can be prepared by synthesis methods known per se for the preparation of macromolecules with side groups. In principle, the following routes can be used:

1. Incorporation of the thioxanthone radicals of the formula I and of the imidyl groupings of the formula II into an existing polymer chain;
2. Build-up of the polymer chain from monomers which already contain the thioxanthone grouping of the formula I and the imidyl grouping of the formula II, in which case the polymer chain can be built up by polymerisation.

In some cases, identical products can be obtained by method 1 and method 2, so that, depending on the nature of the functional groups, it is possible to use method 1 or method 2 as desired. If the radicals of the formulae I or II are incorporated into an already existing polymer chain, this incorporation is effected either by a condensation reaction or by an addition reaction with simultaneous opening of a ring system, for example of a dicarboxylic acid anhydride group or of an epoxide group.

In accordance with the abovementioned build-up method, polymers according to the invention can be prepared by either
(A) polymerising a compound of the formula Ia

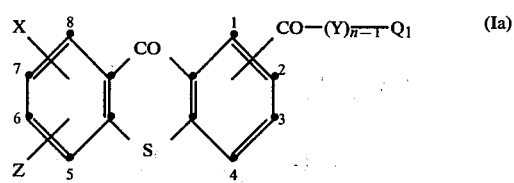

in which Q$_1$ is —OCH=CH$_2$, —OCH$_2$CH=CH$_2$, —SCH$_2$CH=CH$_2$ or —NHCH$_2$CH=CH$_2$ if n is 1, and is —OCO—C(R'')=CH$_2$, —S-CO—C(R'')=CH$_2$, —NHCO—C(R'')=CH$_2$, —OCH=CH$_2$ or

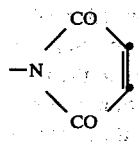

if n is 2, or is also —CH=CH₂ if R₁ is alkylene or phenylene, and R″ is hydrogen or methyl, and X, Y, Z and n are as defined under formula I, and a compound of the formula IIa

in which "imidyl" is a radical of the formula II, n and R₁ are as defined under formula I and Q₂ is

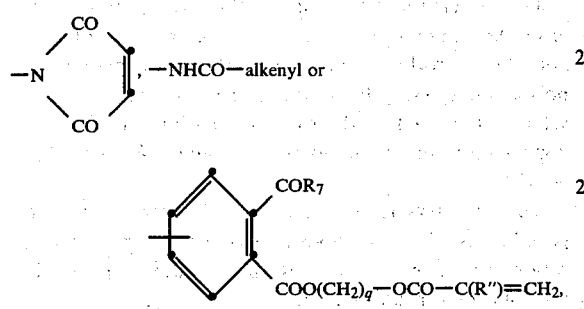

if n is 1 and is —CO—O—alkenyl, —O—alkenyl, —OCO—alkenyl, —NHCO—alkenyl or —S-CO—alkenyl, if n is 2, the alkenyl moieties having 2-4 C atoms, and R₇ is —OH or —O⁻M⁺, M⁺ is an alkali metal cation, a pyridinium cation or a trialkylammonium cation having a total of 3-24 C atoms, q is an integer from 2 to 4 and R″ is hydrogen or methyl, if desired in the presence of comonomers, the molar ratio of compounds of the formula Ia+IIa to the comonomers being 5.1:94.9 to 100:0 and the molar ratio of the compound of the formula Ia to the compound of the formula IIa being 0.1:99.9 to 10:1, or (B) reacting a compound of the formula Ib

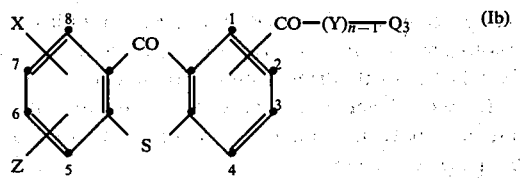

in which X, Y, Z and n are as defined under formula I, Q₃ is

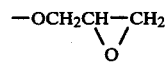

or —OCH₂—COOH if n is 1, and is —OH, —SH, —NH₂, —NHR′, —SO₃H, —COOH, —COCl, —NCO or

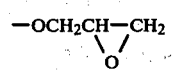

if n is 2, and R′ is alkyl having 1 to 5 C atoms, and a compound of the formula IIb

in which "imidyl" is a radical of the formula II, R₁ and n are as defined under formula I, Q₄ is

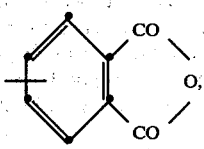

if n is 1, and is —OH, —SH, —NH₂, —NHR′, —COOH or —COCl, if n is 2, and R′ is alkyl having 1-5 C atoms, with a polymer containing corresponding functional groups, in a molar ratio of componds of the formulae Ib+IIb to the polymer of 5.1:100 to 1:1, based on the number of recurring structural elements in the polymer, the molar ratio of the compound of the formula Ib to the compound of the formula IIb being 0.1:99.9 to 10:1.

Preferably, the molar ratio of the compound of the formula Ia+the compound of the formula IIa to comonomers in method (A) is 10.1:89.9 to 100:0 and in particular 30.1:69.9 to 100:0, and the molar ratio of the compound of the formula Ia to the compound of the formula IIa is 0.1:99.9 to 3:1 and in particular 1:1 to 1:3.

Preferably, the molar ratio of the compounds of the formulae Ib and IIb to the polymer in method (B) is 10.1:100 to 1:1 and in particular 30.1:100 to 1:1, based on the number of recurring structural elements in the polymer, and the molar ratio of the compound of the formula Ib to the compound of the formula IIb is 0.1:99.9 to 3:1 and in particular 1:1 to 1:3.

Q₁ and Q₂ preferably independently of one another are —OCH=CH₂, —SCO—C(R″)=CH₂, —NH-CO—C(R″)=CH₂ and especially —O-CO—C(R″)=CH₂ or CH=CH₂.

Compounds of the formula Ib in which Q₃ is —NH₂ or —NHR′ can also be in the form of salts, in particular salts with inorganic acids, such as HCl, H₂SO₄ or nitric acid. Q₃ and Q₄ preferably independently of one another are —OH, —SH, —NH₂, —NHR′, —COOH or —COCl.

Compounds of the formulae Ib and IIb in which Q₃ and Q₄ are —COOH, —COCl, —SO₃H, —OCH₂COOH or

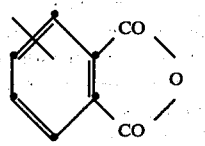

can, for example, be reacted with polymers which contain free —OH, —NH₂, —NH-alkyl or —SH groups. Compounds of the formulae Ib and IIb in which Q₃ and Q₄ are —OH, —SH, —NH₂, —NHR′, —NCO or

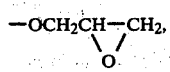

and also the corresponding salts, are suitable, for example, for reaction with polymers which contain anhydride or —COOH groups. Finally, compounds of the formulae Ib and IIb in which $Q_3$ and $Q_4$ are —OH, —SH, —NH$_2$, —NHR' or —COOH, or corresponding salts, can also be reacted with polymers which contain

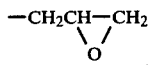

groups.

It is also possible to combine methods (A) and (B), by first using the build-up method to prepare a copolymer with suitable functional groups and 0.1 to 50 percent of thioxanthone groupings of the formula I, in side chains, or 5 to 99.9 percent of imidyl groups of the formula II, in side chains, (based on the number of recurring structural elements in the copolymer) and then using the incorporation method to react a compound of the formula IIb in a ratio of 99.9:100 or 1:20, or a compound of the formula Ib in a ratio of 0.1:100 to 1:2, with the copolymer, the ratios indicated being based on the number of recurring structural elements in the starting copolymer.

Alkyl, alkoxy, or alkylthio groups $G_1$, $G_2$, X, Z, R' or $R_2$, according to the definition, and alkyl moieties in radicals X or Z can be straight-chain or branched. Alkylene groups $R_1$ and alkyl groups $R_2$ preferably have a total of not more than 18 and in particular not more than 12 C atoms.

Examples of alkyl, alkoxy, alkylthio, alkylsulfonyl, N,N-dialkylamino and —CO—alkyl groups $G_1$, $G_2$, X, Z, R' or $R_2$ according to the definition are: the methyl, ethyl, n-propyl, isopropyl, n-butyl, sec.-butyl, n-pentyl, 2- or 3-pentyl, n-hexyl, n-heptyl, 2- or 3-heptyl, n-octyl, n-nonyl, n-decyl, 2-decyl, n-dodecyl, n-tridecyl, tridec-7-yl, heptadec-9-yl, 2,6,10-trimethyldodecyl and 2,6,10,14-tetramethylhexadecyl groups; the methoxy, ethoxy, n-propoxy, isopropoxy and n-butoxy groups; the methylthio, ethylthio and n-propylthio groups; the methylsulfonyl and ethylsulfonyl groups, the N,N-dimethylamino, N,N-diethylamino, N-methyl-N-ethylamino and N,N-di-n-propylamino groups; and the acetyl, propionyl and butyryl groups.

Alkyl groups $G_1$, $G_2$, R', X and Z are preferably straight-chain and in particular have 1 or 2 C atoms. $G_1$ and $G_2$ are preferably together trimethylene or tetramethylene, but in particular are each methyl.

Examples of alkylene groups $R_1$ according to the definition are: the 1,2-ethylene, propylene, tetramethylene, isobutylene, pentamethylene, iso- and neo-pentylene, hexamethylene, heptamethylene, 2- or 3-methylhexylene, octamethylene, nonamethylene, decamethylene, 2-methyl-nonylene, dodecamethylene, tridecamethylene, hexylheptylene, octylnonylene, 2,6,10-trimethyldecylene and 2,6,10,14-tetramethyldodecylene groups.

A cyclopentylene, cyclohexylene or phenylene group $R_1$ is, for example, the 1,3-cyclopentylene group, the 1,3- or in particular 1,4-cyclohexylene group or the 1,3- or 1,4-phenylene group.

$R_1$ is preferably alkylene having a total of 2–18 and in particular 2–12 C atoms, 1,3-cyclopentylene, 1,4-cyclohexylene or a —(CH$_2$CH$_2$O)$_2$—CH$_2$CH$_2$—group. $R_2$ is preferably hydrogen. M$^+$ is, for example, the lithium, sodium, trimethylammonium, triethylammonium, methyldiethylammonium or tri-n-octylammonium cation. Preferably, M$^+$ is an alkali metal cation, especially the sodium cation.

Preferred polymers according to the invention are those which have groupings of the formulae I and II in which $G_1$ and $G_2$ are each methyl and Z is hydrogen, X, Y and n are as defined under formula I and the grouping —CO—(Y)$_{\overline{n-1}}$ is in the 1-position or 3-position.

A further category of preferred polymers comprises those which have groupings of the formulae I and II in which $G_1$ and $G_2$ are each methyl, X is bonded in the 6-position and is —NO$_2$, alkylsulfonyl having 1–4 and in particular 1 or 2 C atoms or phenylsulfonyl, Z is bonded in the 7-position and is alkyl, alkoxy, alkylthio or N,N-dialkylamino having, in each case, 1–4 C atoms and in particular 1 or 2 C atoms in the alkyl moieties, and the grouping —CO—(Y)$_{\overline{n-1}}$ is in the 1-position or 3-position.

According to a further preference, $G_1$ and $G_2$ are each methyl, Z is hydrogen, X is bonded in the 6-position and is —NO$_2$, alkylsulfonyl having 1–4 C atoms and in particular 1 or 2 C atoms or phenylsulfonyl, and the grouping —CO—(Y)$_{\overline{n-1}}$ is in the 1-position or 3-position.

Very particularly preferred polymers are those which have groupings of the formulae I and II in which X is hydrogen, Z is hydrogen or methyl or methoxy bonded in the 7-position and $G_1$ and $G_2$ are each methyl, and the group —CO—(Y)$_{\overline{n-1}}$ is in the 1-position or 3-position, Y is —OR$_1$— or —NHR$_1$—, the hetero-atom of the radical Y being bonded to the —CO group, and $R_1'$ is alkylene having 2–6 C atoms.

Compounds of the formulae Ia and IIa are suitable for homopolymerisation or for copolymerisation with other ethylenically unsaturated comonomers, especially those of the type indicated further below.

Examples of starting polymers which can be reacted with compounds of the formulae Ib and IIb are: polyacrylic acid, polymethacrylic acid, copolymers of these acids and other ethylenically unsaturated monomers, copolymers built up from maleic anhydride and ethylenically unsaturated monomers, such as methyl vinyl ether, ethylene, styrene, hex-1-ene, dec-1-ene, tetradec-1-ene and octadec-1-ene; polymers having free hydroxy groups, such as homopolymers and copolymers of hydroxyalkyl acrylates and hydroxyalkyl methacrylates, polyvinyl alcohols, natural and regenerated cellulose, cellulose derivatives, hydroxyalkylcellulose, polyethers having free —OH groups, phenol-formaldehyde polycondensation products, polymers having free glycidyl groups, such as copolymers based on glycidyl acrylates and glycidyl methacrylates, polyethyleneimines and polymers with free amino groups in side chains, for example poly-p-amino-styrene.

Preferred polymers according to the invention are those which have a mean molecular weight of about 10,000 to 1,000,000 and contain, on the one hand, recurring structural elements of at least one of the formulae IIIa to XIa

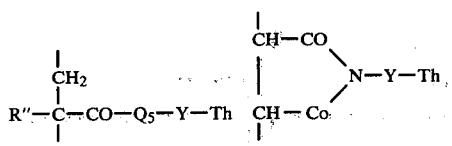

(IIIa)         (IVa)

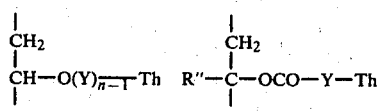

(Va)    (VIa)

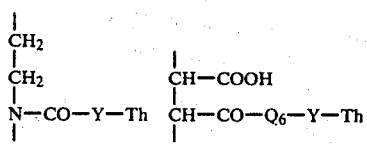

(VIIa)    (VIIIa)

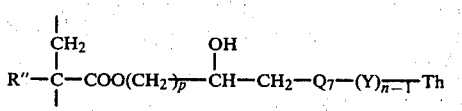

(IXa)

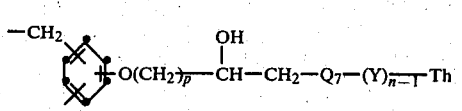

(Xa)

or

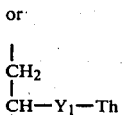

(XIa)

and, on the other hand, recurring structural elements of at least one of the formulae IIIb to XIIIb

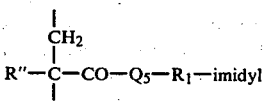

(IIIb)

(IVb)

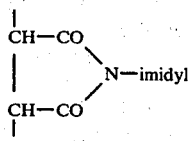

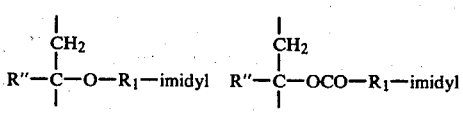

(Vb)    (VIb)

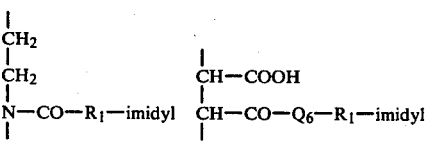

(VIIb)    (VIIIb)

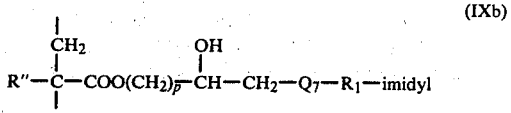

(IXb)

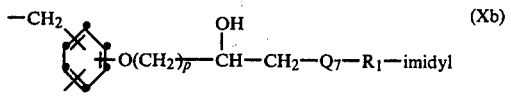

(Xb)

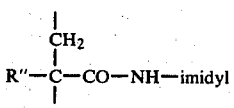

(XIb)

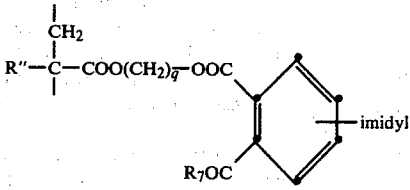

(XIIb)

or

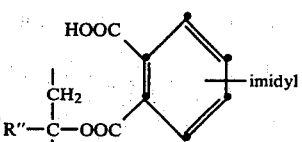

(XIIIb)

in which formulae "TH" is a radical of the formula I' and "imidyl" is a radical of the formula II, X, Y, Z, $R_1$ and n are as defined under formula I, $Q_5$ is —O—, —S— or —NH—, $Q_6$ is —O—, —S—, —NH— or —N(R')—, $Q_7$ is —OCO—, —O—, —S—, —NH— or —N(R')—, R' is alkyl having 1-5 C atoms, R" is hydrogen or methyl, $R_7$ is —OH or —O$^-$M$^+$, M$^+$ is an alkali metal, pyridinium or trialkylammonium cation having 3-24 and in particular 3-12 C atoms, p is the number 1 or 2, q is an integer from 2 to 4, $Y_1$ is —O$R_1'$—, —S$R_1'$— or —NH$R_1'$, the hetero-atom of the radical $Y_1$ being bonded to the —CO group, and $R_1'$ is straight-chain or branched alkylene having a total of 2-23 C atoms and 2-13 C atoms in the main chain, or phenylene.

If the polymers according to the invention are copolymers with other unsaturated compounds, these preferably consist of recurring structural elements of at least one of the formulae IIIa to XIa and at least one of the formulae IIIb to XIIIb and of recurring structural elements of the formula XIV

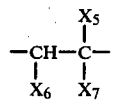 (XIV)

in which X₆ is hydrogen, X₅ is hydrogen, chlorine or methyl and X₇ is hydrogen, methyl, chlorine, —CN, —COOH, —CONH₂, phenyl, methylphenyl, methoxyphenyl, cyclohexyl, pyridyl, imidazolyl, pyrrolidyl, —COO—alkyl having 1–12 C atoms in the alkyl moiety, —COO—phenyl,

—COO—alkylene-OH having 1–3 C atoms in the alkylene moiety, —OCO—alkyl having 1–4 C atoms in the alkyl moiety, —OCO— phenyl, —CO—alkyl having 1–3 C atoms in the alkyl, alkoxy having 1–20 C atoms or phenoxy, or X₅ is hydrogen and X₆ and X₇ together are the grouping

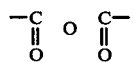

or are each —COOH or —COO—alkyl having 1–6 C atoms in the alkyl. Preferably X₄ and X₆ are each hydrogen, X₅ is hydrogen or methyl and X₇ is —OCOCH₃, —COOH or —COO—alkyl having 1–8 C atoms in the alkyl, or X₅ and X₆ each denote hydrogen and X₇ is —CN, chlorine, phenyl or alkoxy having 1–6 C atoms, especially methoxy.

In the above formulae IIIa to XIa, IIIb to XIIIb and I′, G₁, G₂, X, Z, n, Y and R₁ advantageously have the preferred meanings defined above and the carbonyl group in formula I′ is preferably bonded in the 1-position or 3-position to the benzene ring. Particularly preferred polymers are those containing recurring structural elements of at least one of the formulae IIIa, Va, VIa, VIIIa or XIa and recurring structural elements of at least one of the formulae IIIb, Vb, VIb or VIIIb and, if desired, recurring structural elements of the formula XIV, and in particular polymers which contain recurring structural elements of at least one of the formulae IIIa and VIIIa and recurring structural elements of at least one of the formulae IIIb and VIIIb and also, if desired, recurring structural elements of the formula XIV, in which R″ is hydrogen or methyl, Q₅ is —O—, Q₆ is —O— or —NH—, n is the number 1 or 2, Y is —OR₁— or —NHR₁—, the hetero-atom of the radical Y being bonded to the —CO group, R₁ is alkylene having 2–6 C atoms, X is hydrogen, Z is hydrogen or methyl or methoxy bonded in the 7-position, X₆ is hydrogen, X₅ is hydrogen or methyl and X₇ is —O-COCH₃, —COOH or —COO—alkyl having 1–8 C atoms in the alkyl, or X₅ and X₆ are each hydrogen and X₇ is —CN, chlorine, phenyl or alkoxy having 1–6 C atoms, especially methoxy, and the carbonyl group in formula I′ is bonded in the 1-position or 3-position to the benzene ring. Particularly preferred polymers are those which contain recurring structural elements of the formulae IIIa and IIIb and also recurring structural elements of the formula XIV, in which R″ is methyl, Q₅ is —O—, Y is —O—CH₂CH₂—, the oxygen atom of the radical Y being bonded to the —CO group, R₁ is —CH₂CH₂—, X₅ and X₆ are each hydrogen and X₇ is —COO—CH₂CH₃, the radical "Th" is the group

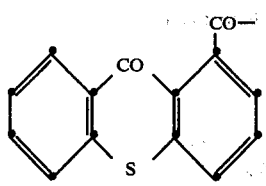

and the radical "imidyl" is the group

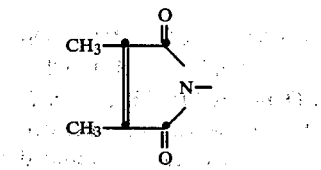

and polymers which contain recurring structural elements of the formulae IIIa and IIIb and also recurring structural elements of the formula XIV, in which R″ is methyl, Q₅ is —O—, Y is —O—CH₂CH₂—, the oxygen atom of the radical Y being bonded to the —CO group, R₁ is —CH₂CH₂—, X₅ is hydrogen, X₆ is methyl and X₇ is —COO—n—butyl or —COOH, the radical "Th" is the group

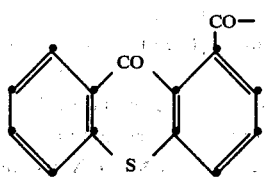

and the radical "imidyl" is the group

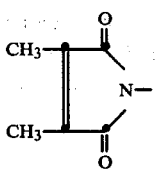

Polymers which contain, on the one hand, recurring structural elements of at least one of the formulae IIIa, IVa, Va or XIa and, on the other hand, recurring structural elements of at least one of the formulae IIIb, IVb, Vb, VIb, XIb or XIIb can be obtained by polymerising a compound of the formula Ia, in which X, Y, Z and n are as defined above and Q₁ is —OCH=CH₂ if n is 1, and is —OCO—C(R″)=CH₂, —SCO—C(R″)=CH₂, —NHCO—C(R″)=CH₂, —OCH=CH₂ or

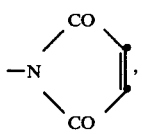

if n is 2, or is also —CH=CH₂ if R₁ is alkylene or phenylene, and a compound of the formula IIa, in which R₁ and n are as defined above and Q₂ is.

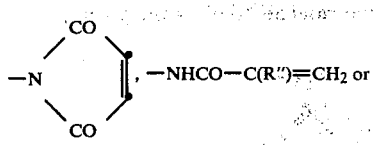, —NHCO—C(R″)=CH₂ or

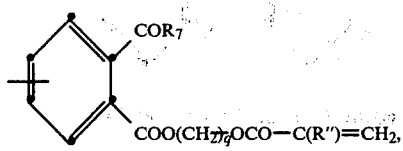

if n is 1, and is —OCO—C(R″)=CH₂, —S-CO—C(R″)=CH₂, —NHCO—C(R″)=CH₂, —O—C(R″)=CH₂ or —COO—C(R″)=CH₂, if n is 2, if desired in the presence of an ethylenically unsaturated comonomer, especially an ethylenically unsaturated comonomer of the formula XIVa

 (XIVa)

in which formulae $X_5$ to $X_7$, R″, $R_7$ and q are as defined above and what has been stated above applies in respect of the molar ratios of the reactants.

Polymers which contain, on the one hand, recurring structural elements of at least one of the formulae IIIa, VIa, VIIa, VIIIa, IXa or Xa and, on the other hand, recurring structural elements of at least one of the formulae IIIb, VIb, VIIb, VIIIb, IXb, Xb or XIIIb can be obtained by simultaneously or step-wise.

(i) reacting a compound of the formula Ib or IIb, in which $G_1$, $G_2$, X, Z, $R_1$ and Y are as defined and, if n is 2, $Q_3$ and $Q_4$ independently of one another are —OH, —SH or —NH₂, with a polymer containing recurring structural elements of the formula III

 (III)

(ii) reacting a compound of the formula Ib or IIb, in which $G_1$, $G_2$, X, Z, $R_1$ and Y are as defined, $Q_3$ is —COOH or —COCl (n=2) and $Q_4$ is

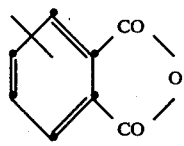

if n is 1, and is —COOH or —COCl is n is 2, with a polymer containing recurring structural elements of the formula VI or VII

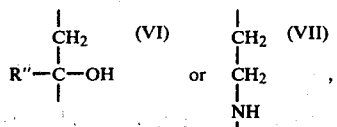 (VI) 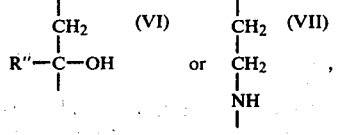 (VII)

(iii) reacting a compound of the formula Ib or IIb, in which $G_1$, $G_2$, X, $R_1$, Z and Y are as defined, n is 2 and $Q_3$ is —OH, —SH, —NH₂, —NHR′ or —NCO and $Q_4$ is —OH, —SH, —NH₂ or —NHR′, with a polymer containing recurring structural elements of the formula VIII

 (VIII)

and (iv) reacting a compound of the formula Ib and/or IIb, in which $G_1$, $G_2$, X, Z, $R_1$ and Y are as defined, n is 2 and $Q_3$ and/or $Q_4$ are —OH, —SH, —NH₂, —NHR′ or —COOH, with a polymer containing recurring structural elements of the formula IX or X

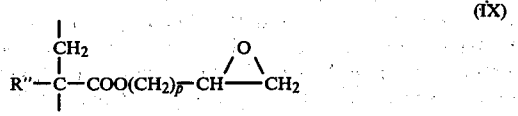 (IX)

or

 (X)

in which p and R″ are as defined above, what has been stated above applying in respect of the molar ratios of the reactants.

Polymers containing recurring structural elements of the formula IXa, in which p is the number 1, can also be obtained by reacting a compound of the formula Ib, in which X, Z, Y and n are as defined and $Q_3$ is

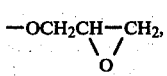

with a polymer containing recurring structural elements of the formula III

what has been stated above applying in respect of the molar ratios of the reactants.

If desired, it is also possible to use copolymers, for example polymers with different recurring structural elements of the formulae III, VI to X and XIV, with compounds of the formulae Ib and IIb containing corresponding functional groups for incorporation into existing polymers.

The incorporation of the thioxanthone and imidyl groupings into existing polymer chains by means of a condensation reaction or addition reaction can be effected in a manner known per se, advantageously at temperatures of about −50° C. to +150° C. The reaction is preferably carried out in an inert organic solvent or a solvent mixture, and in the case of condensation reactions is preferably carried out at temperatures of about −20° C. to +100° C. Addition reactions are advantageously carried out at elevated temperature, in general at temperatures between about 80 and 120° C. or at the reflux temperature. Suitable solvents for carrying out the condensation reactions and addition reactions are, for example: aliphatic or cyclic ketones, such as acetone, methyl ethyl ketone, isopropyl methyl ketone, cyclohexanone, cyclopentanone and Y-butyrolactone; cyclic ethers, such as tetrahydrofuran, tetrahydropyran or dioxane; cyclic amides, such as N-methyl-2-pyrrolidone, N-ethyl-2-pyrrolidone or N-methyl-ε-caprolactam; N,N-dialkylamides of aliphatic monocarboxylic acids having 1–3 C atoms in the acid moiety, such as N,N-dimethylformamide, N,N-dimethylacetamide, N,N-diethylacetamide or N,N-dimethylmethoxyacetamide; pyridine and pyridine bases or tertiary amines, in particular trialkylamines and dialkylbenzylamines having, preferably, 1–4 C atoms in the alkyl moieties, for example triethylamine and diethylbenzylamine; and dialkylsulfoxides, such as dimethylsulfoxide and diethylsulfoxide. Preferred solvents for condensation reactions are cyclic amides and N,N-dialkylamides of the abovementioned type, especially N-methyl-2-pyrrolidone, N,N-dimethylformamide and N,N-dimethylacetamide. For addition reactions, cyclic ethers and cyclic ketones, in particular tetrahydrofuran and cyclohexanone, and also pyridine are preferred.

The polymerisation of compounds of the formula Ia and IIb, and also the copolymerisation of these compounds with other ethylenically unsaturated monomers, for example those of the formula XIVa, can likewise be carried out in a manner known per se, for example in the presence of conventional cationic and anionic initiators. Free radical polymerisation is preferred. Advantageously, free radical initiators known per se, such as inorganic or organic peroxides or azo compounds, for example hydrogen peroxide, potassium peroxydisulfate, tert.-butyl hydroperoxide, di-tert.-butyl peroxide, peracetic acid, benzoyl peroxide, diacyl peroxide, cumene hydroperoxide, tert.-butyl perbenzoate, tert.-alkyl peroxycarbonates and α,α′-azoisobutyronitrile, are used in amounts of about 0.01 to 5% by weight and preferably 0.01 to 1.5% by weight, based on the total weight of monomers. The reaction temperatures for free radical polymerisation are in general between about 30° and 100° C. However, free radical polymerisation can also be carried out in the cold, and redox systems in the abovementioned concentrations can also be used for this purpose, for example mixtures of peroxides, such as hydrogen peroxide, and a reducing agent, such as divalent iron ions. The polymerisation can be carried out in homogeneous phase, for example in bulk (block polymerisation) or in solution, or in heterogeneous phase, i.e. as precipitation polymerisation, emulsion polymerisation or suspension polymerisation. Polymerisation in solution is preferred. Suitable solvents are those of the type mentioned for the condensation reaction or addition reaction and also: halogenated aliphatic hydrocarbons, such as methylene chloride, chloroform, tetrachloroethane and tetrachloroethylene; alkyl esters of aliphatic monocarboxylic acids having a total of 2–6 C atoms, such as methyl formate, ethyl formate and n-butyl formate or methyl acetate, ethyl acetate and n-butyl acetate; and ethylene glycol dialkyl ethers having 1–4 C atoms in the alkyl moieties, such as ethylene glycol dimethyl ether, ethylene glycol diethyl ether and ethylene glycol di-n-butyl ether.

The compounds of the formulae IIa and IIb are known per se or can be prepared by the processes described in German Offenlegungsschrift No. 2,626,795. The compounds of the formulae Ia and Ib can be prepared by (a) reacting a compound of the formula (1)

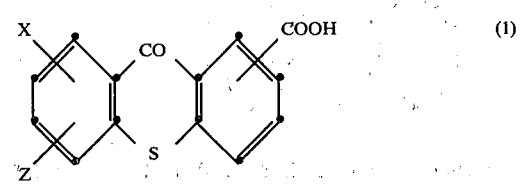

a $C_{1-6}$-alkyl ester of a compound of the formula (1) or an acid chloride of a compound of the formula (1), with a compound of the formula (2a)

or, if Q′ is —NH₂ or —NHR′, with a salt of a compound of the formula (2a), to give a compound of the formula (Ic)

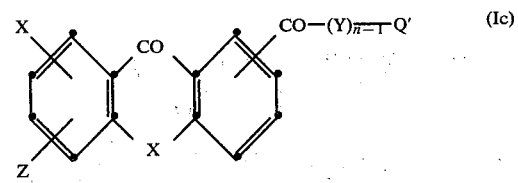

or corresponding salts thereof, (b) reacting a compound of the formula (1) or a $C_{1-6}$-alkyl ester of a compound of the formula (1) with a compound of the formula (2b)

to give a compound of the formula Id

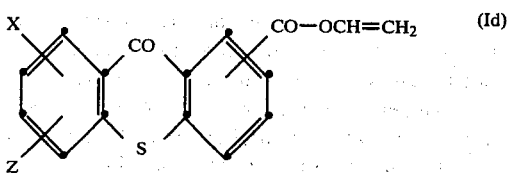

or (c) first reacting an acid chloride of a compound of the formula (1) with a salt of a compound of the formula (2c)

 (2c)

to give the corresponding salt of a compound of the formula (3)

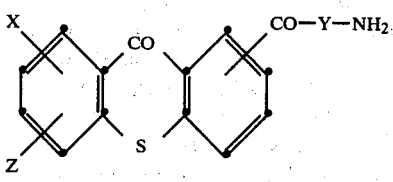

and reacting this salt, in the presence of an inert organic solvent, with phosgene to give a compound of the formula Ie

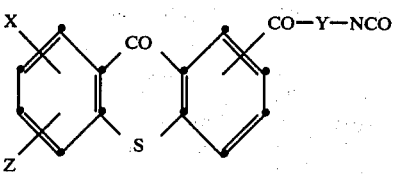

in which formulae X, Y, Z, R' and n are as defined under formula I or Ib, Q' is

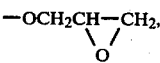

—OCH$_2$—COOH, —OCH$_2$CH=CH$_2$, —SCH$_2$CH=CH$_2$ or —NHCH$_2$CH=CH$_2$ if n is 1, and is —OH, —SH, —NH$_2$, —NHR', —SO$_3$H, —COOH, —OCO—C(R")=CH$_2$, —S-CO—C(R")=CH$_2$, —NHCO—C(R")=CH$_2$,

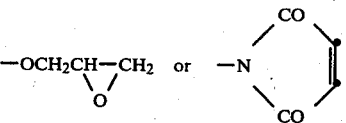

if n is 2, or, is also —CH=CH$_2$ if R$_1$ is alkylene or phenylene, and R" is hydrogen or methyl, and, if desired, subsequently converting the group X in the compounds of the formulae Ic, Id or Ie into a different group X, and/or converting the group Q'=—COOH in formula Ic into the group —COCl by treatment with suitable chlorinating agents. Salts of compounds of the formulae 2a, 2c, Ic and (3) (Q'=—NH$_2$ or —NHR') are, in particular, salts with inorganic acids such as HCl, H$_2$SO$_4$ or nitric acid. Salts of compounds of the formula Ic can be converted into the corresponding amines in a known manner, by the addition of suitable bases.

Examples of chlorinating agents which can be used are thionyl chloride, PCl$_5$ or oxalyl chloride. Alkyl esters, according to the definition, of compounds of the formula (1) are advantageously prepared from the corresponding acid chlorides.

The above reactions can be carried out in a manner known per se and, depending on the nature of the reactants, with or without the addition of inert organic solvents such as dioxane, benzene, toluene, methylene chloride or chloroform. Acid chlorides of compounds of the formula (1) are in general reacted with alcohols or thiols of the formula (2a) at temperatures between about 25° and 80° C. Advantageously, an excess of the corresponding alcohol or thiol is used as the solvent. The reaction of the acid chlorides of compounds of the formula (1) with amines of the formula (2a) is advantageously effected at temperatures between about 0° and 40° C. The reaction of the free acids of the formula (1) with alcohols of the formula (2a) is advantageously carried out with removal of the water by separation as an azeotrope and with addition of catalytic amounts of an acid, such as H$_2$SO$_4$ or p-toluenesulfonic acid, or in the presence of dehydrating agents, such as HCl gas or concentrated sulfuric acid. The entraining agent used is preferably benzene, toluene or chloroform. The transesterification of alkyl esters of compounds of the formula (1) is advantageously effected with the addition of acids, such as HCl or H$_2$SO$_4$, aluminium alcoholates or basic or acid ion exchangers. The reaction of compounds of the formula (1), or their alkyl esters, with compounds of the formula 2b is advantageously carried out in the presence of catalysts, such as HgCl$_2$, Li$_2$(PdCl$_4$) or PdCl$_2$.

Some compounds of the formula Ia or Ib can also be prepared by modified processes, for example as follows:

(1) Compounds of the formula Ia or Ib in which Y is —OR$_1$—, the —O— being bonded to the —CO group, Q$_1$ and Q$_3$ are

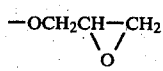

or —OCH$_2$CH—CH$_2$ if n is 1, and are —OH, —SH, —NH$_2$, —NHR', —OCO—C(R")=CH$_2$. —NH-CO—C(R")=CH$_2$, —SCO—C(R")=CH$_2$, —CH=CH$_2$. —OCH=CH$_2$ or

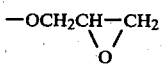

if n is 2, and X and Z are as defined above, by reacting an alkali metal salt or alkaline earth metal salt of a compound of the formula (1), if necessary in the presence of a base, with a halide of the formula (4)

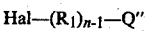 (4)

in which Hal is a halogen atom, especially chlorine or bromine, and Q" is

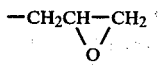

or —CH$_2$CH=CH$_2$ if n is 1, and —OH, —SH, —NH$_2$, —NHR', —OCO—C(R")=CH$_2$, —NH-CO—C(R")=CH$_2$, —SCO—C(R")=CH$_2$, —CH=CH$_2$, —OCH=CH$_2$ or

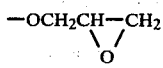

if n is 2, and R$_1$ and n are as defined above, and, if desired, subsequently converting the group X into a different group X.

(2) Compounds of the formula Ia in which X, Y and Z are as defined, n is the number 2 and Q$_1$ is

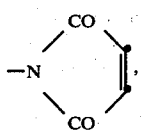

by reacting a compound of the formula (3) with maleic anhydride, cyclising the resulting amidocarboxylic acid in a manner known per se, for example in the presence of acetic anhydride and sodium acetate, and, if desired, subsequently converting the group X into a different group X.

(3) By reacting compounds of the formula Ib in which X, Y and Z are as defined, n is the number 2 and Q$_3$ is —OH, —SH or —NH$_2$ with a halide of the formula (5)

$$\text{Hal—CO—C(R")=CH}_2 \quad (5)$$

in which Hal is a halogen atom, especially chlorine or bromine, and R" is hydrogen or methyl.

(4) Compounds of the formula Ib in which n is 1 or 2 and Q$_3$ is

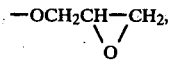

by reacting an alkali metal salt or alkaline earth metal salt of a compound of the formula (6)

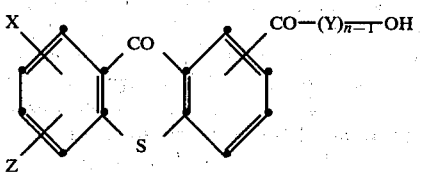

in which n, X, Y and Z are as defined above, with epichlorohydrin or epibromohydrin, if necessary in the presence of a base.

The alkali metal salts or alkaline earth metal salts of compounds of the formula (1) or (6) which are used in the above reactions are, for example, calcium salts or barium salts and in particular sodium salts or potassium salts. Bases which can be used are, for example, amines, such as diethylamine and triethylamine. Reactions (1) and (4) can also be carried out by means of phase transfer catalysis, for example in the presence of tetraalkyl- or trialkylbenzyl-ammonium halides having, in each case, 1–4 C atoms in the alkyl groups, and K$_2$CO$_3$ or Na$_2$CO$_3$.

The starting compounds of the formulae (2a), (2b) and (2c) are known or can be prepared by methods known per se. Some of the compounds of the formula (1) are also known. They can be prepared in a manner known per se (cf. German Offenlegungsschrift No. 2,344,799 and U.S. Pat. No. 4,101,558), for example by cyclising a compound of the formula (7a) or (7b)

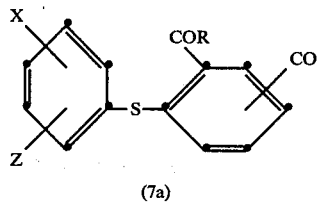

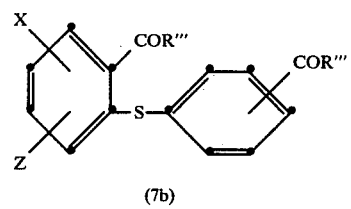

in which X and Z are as defined above and R and R''' are —OH or chlorine, or, if the —COR groups are in the orthoposition relative to one another, the two R's together can be —O—, with simultaneous hydrolysis of chlorine atoms R or R'''.

Starting materials of the formula (1) in which X is hydrogen, halogen, —CN, —NO$_2$, phenylsulfonyl, alkylsulfonyl, alkyl, alkoxy, alkylthio or N,N-dialkylamino having, in each case, 1–4 C atoms in the alkyl moieties and Z is as defined can also be prepared by (α) cyclising a compound of the formula (8a)

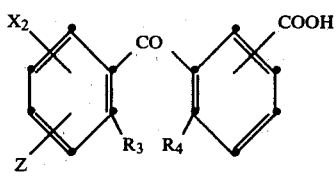

in which Z is as defined, X$_2$ is hydrogen, halogen, —CN, —NO$_2$, phenylsulfonyl or alkylsulfonyl, alkyl, alkoxy, alkylthio or N,N-dialkylamino having, in each case, 1–4 C atoms in the alkyl moieties, one of R$_3$ and R$_4$ in a mercapto group and the other is a detachable group, or (β) cyclising a compound of the formula (8b)

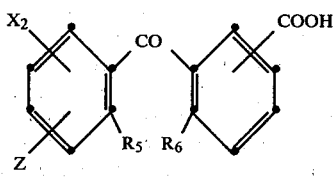

in which X$_2$ and Z are as defined above and R$_5$ and R$_6$ independently of one another are a detachable group, with an inorganic sulfide to give a compound of the formula (1).

Finally, starting compounds of the formula (1) in which X is hydrogen, halogen, —NO₂, phenylsulfonyl or alkylsulfonyl, alkyl, alkoxy, alkylthio, N,N-dialkylamino or —CO—alkyl having, in each case, 1-4 C atoms in the alkyl moieties and Z is as defined can also be obtained by reacting a compound of the formula (9)

in the presence of a Friedel-Crafts catalyst, with a compound of the formula (10)

in which $X_3$ is hydrogen, halogen, —NO₂, phenylsulfonyl or alkylsulfonyl, alkyl, alkoxy, alkylthio, N,N-dialkylamino or —CO—alkyl having, in each case, 1-4 C atoms in the alkyl moieties and Z is as defined above, and decomposing the resulting complex to give a compound of the formula (1).

The cyclisation of the compounds of the formulae (7a) and (7b) is advantageously carried out in the presence of a proton acid or of a Lewis acid. Examples of suitable proton acids are polyphosphoric acid, if desired in a mixture with phosphorus oxychloride, chlorosulfonic acid and sulfuric acid. Suitable Lewis acids are, for example, aluminium trichloride or boron trifluoride. The starting compounds of the formulae (7a) and (7b) can, for example, be prepared analogously to the procedures described in German Offenlegungsschrift No. 2,344,799, by reacting suitably substituted thiophenols or derivatives thereof, such as alkali metal salts or alkaline earth metal salts, with nitrobenzenes or halogenobenzenes. For this reaction, the thiophenol and the nitro- or halogeno-benzene together must have at least two —COR or —COR''' groups, or two groups which can be converted to —COR or —COR''' groups, such as nitrile groups, and one of these groups must be in the ortho-position relative to the SH group or to the nitro group or to a halogen atom. Suitable nitrobenzenes are those which, in addition to the nitro group, also contain one or more electron-attracting groups, such as carboxylic acid ester groups, carboxylic acid chloride groups, nitrile groups, anhydride groups or imide groups. According to a preferred process, compounds of the formula (7a) are prepared by reacting a dicarboxylic acid alkyl ester of nitrophthalic acid, nitroisophthalic acid or nitroterephthalic acid with a suitably substituted thiophenol and then saponifying the resulting dicarboxylic acid alkyl ester of a compound of the formula (7a). Detachable groups $R_3$ to $R_6$ are, in particular, halogen atoms and nitro, arylsulfonyl and sulfinyl groups. Preferred detachable groups $R_3$ to $R_6$ are halogen atoms, especially chlorine, and nitro groups.

The inorganic sulfide used for reaction with compounds of the formula (7b) is advantageously an alkali metal sulfide or hydrosulfide or alkaline earth metal sulfide or hydrosulfide, preferably sodium sulfide. The starting materials of the formulae (8a) and (8b) can be obtained in a manner known per se, by Friedel-Crafts reaction of correspondingly substituted acyl halides with suitably substituted nucleophilic aromatic compounds.

The condensation reaction of the compounds of the formula (9) with the compounds of the formula (10) in the presence of Friedel-Crafts catalysts, especially aluminium trichloride, is advantageously carried out in an organic medium at temperatures between about 10° and 80° C. After the reaction has ended, the resulting complex can be decomposed by pouring into a water/ice mixture or by adding dilute mineral acid, such as hydrochloric acid, or aqueous solutions of an alkali metal hydroxide or alkaline earth metal hydroxide, such as sodium hydroxide, potassium hydroxide, barium hydroxide or calcium hydroxide.

The conversion of groups X, $X_2$ or $X_3$ to different groups X can be carried out in a manner known per se. Thus, for example, nitro groups X, $X_2$ or $X_3$ can be reduced, by methods known per se, to amino groups, which, in turn, can be converted to halogen atoms or —CN, alkoxy or N,N-dialkylamino groups. Cyano groups X or $X_2$ can be converted to —CO—alkyl groups X. Thioxanthones of the formulae Ia and Ib which are substituted by alkylsulfonyl or phenylsulfonyl groups can be prepared, for example, by reacting the corresponding nitro compounds with alkali metal alkyl sulfinates or alkali metal phenyl sulfinates.

The polymers according to the invention can be used, for example, for the production of highly light-sensitive image materials, such as copy for reproduction, or for the production of printing plates for the offset printing process and for the preparation of photo-offset lacquers, for unconventional photography, for example for the production of photographic images by means of photopolymerisation or photocrosslinking. They are used, in particular as so-called photoresists for the production of printed circuits by methods known per se. For this purpose, that side of the printed board assembly which is provided with the light-sensitive coating is exposed through a line or grid slide negative carrying the conductive pattern and then developed, after which the unexposed areas of the coating are removed using developer fluid.

The photocrosslinkable polymers according to the invention, in which the thioxanthone groupings, i.e. the sensitiser, are covalently bonded to the polymer backbone, are distinguished by high photosensitivity of the photocrosslinkable groups. In addition, as a result of this covalent incorporation of the sensitiser molecules into the photocrosslinkable polymers, the problems of solubility and of demixing in the polymer can be avoided.

A. PREPARATION EXAMPLES

EXAMPLE 1

27.14 g (0.14 mol) of N-[β-(methacryloyloxy)-ethyl]-dimethylmaleimide [prepared in accordance with German Offenlegungsschrift No. 2,626,795], 2.86 g (0.029 mol) of ethyl acrylate, 0.9 g (0.0027 mol) of β-(methacryloyloxy)-ethyl thioxanthone-1-carboxylate and 100 ml of tetrahydrofuran are initially introduced into a three-necked flask, which is under a stream of nitrogen. A solution of 0.15 g of azoisobutyronitrile in 20 ml of tetrahydrofuran is added at 66° C., under an inert gas atmosphere, and the reaction mixture is stirred under reflux (66° C.) for 16 hours. The polymer solution is precipitated in diethyl ether and the polymer is dried in vacuo at 40° C. 25.3 g (81.9% of theory) of polymer are obtained (polymer No. 1).

Intrinsic viscosity $\eta_{int}$=0.35 dl/g in $CHCl_3$ at 20° C.; mean molecular weight=619,299.

EXAMPLE 2

18.58 g (0.078 mol) of N-[β-(methacryloyloxy)-ethyl]dimethylmaleimide, 1.96 g (0.0196 mol) of ethyl acrylate, 0.308 g (0.000916 mol) of β-(methacryloyloxy)-ethyl thioxanthone-1-carboxylate and 70 ml of tetrahydrofuran are initially introduced into a three-necked flask which is under a stream of nitrogen. A solution of 0.102 g of azoisobutyronitrile in 12 ml of tetrahydrofuran is added at 66° C., in an inert gas atmosphere, and the reaction mixture is stirred under reflux (66° C.) for 16 hours. The polymer solution is precipitated in diethyl ether and the polymer is dried in vacuo at 40° C. 17.4 g (83.5% of theory) of polymer are obtained (polymer No. 2). $\eta_{int}$=0.28 dl/g in $CHCl_3$ at 20° C.

EXAMPLE 3

27.14 g (0.115 mol) of N-[β-(methacryloyloxy)-ethyl]dimethylmaleimide, 2.86 g (0.029 mol) of ethyl acrylate, 0.15 g (0.00045 mol) of β-(methacryloyloxy)-ethyl thioxanthone-1-carboxylate and 100 ml of tetrahydrofuran are initially introduced into a three-necked flask, which is under a stream of nitrogen. A solution of 0.15 g of azoisobutyronitrile in 20 ml of tetrahydrofuran is added at 66° C., under an inert gas atmosphere, and the reaction mixture is stirred under reflux (66° C.) for 16 hours. The polymer solution is precipitated in diethyl ether and the polymer is dried in vacuo at 40° C. 26.3 g (87.2% of theory) of polymer are obtained (polymer No. 3). $\eta_{int}$=0.27 dl/g in $CHCl_3$ at 20° C.

The β-(methacryloyloxy)-ethyl thioxanthone-1-carboxylate used in the above Examples 1–3 is prepared as follows: Dry sodium thiophenolate prepared from 7.5 g (0.33 gram equivalent) of sodium, 300 ml of methanol and 36 ml (0.33 mol) of thiophenol is dissolved in 300 ml of dimethylsulfoxide, and 80.4 g (0.3 mol) of 3-nitrophthalic acid N-phenylimide are added. The reaction mixture is heated at 50° C. for 90 minutes and then poured into a mixture of 300 ml of water and 300 ml of anhydrous acetic acid. The resulting suspension is filtered with suction and the product is dried at 80° C./13,000 Pa. 100 g (100% of theory) of 3-phenylthiophthalic acid N-phenylimide are obtained. 99.4 g (0.3 mol) of 3-phenylthiophthalic acid N-phenylimide are suspended in 1,326 ml of a 20% sodium hydroxide solution and the suspension is heated at 100° C. for 30 minutes, with stirring. After cooling, the alkaline suspension is acidified with 672 ml of 37% hydrochloric acid, with stirring. After one hour, the fine suspension is filtered with suction, the material on the suction filter is suspended, whilst still wet, in 882 ml of 37% hydrochloric acid and the suspension is refluxed for one hour. The reaction mixture is cooled, the resulting fine suspension is filtered with suction and the product is dried at 80° C./13,000 Pa. 69.4 g (85% of theory) of 3-phenylthiophthalic acid are obtained. 69 g (0.25 mol) of 3-phenylthiophthalic acid and 700 ml of polyphosphoric acid are heated at 200° C. for 90 minutes, with stirring, then cooled and stirred into 3,000 ml of water. After one hour the resulting suspension is filtered with suction and the material on the suction filter is washed with water and dried at 80° C. The resulting crude product is dissolved in 350 ml of hot N,N-dimethylformamide, animal charcoal is added and the mixture is filtered. The filtrate is diluted with five times the amount of water, the resulting suspension is filtered and the product is washed with water and dried. 63 g (98% of theory) of thioxanthone-1-carboxylic acid are obtained; melting point 259° C. The acid obtained in this way can be further used direct. 82 g (0.32 mol) of thioxanthone-1-carboxylic acid in 460 ml of thionyl chloride are refluxed for 5 hours. The resulting dark, clear solution is evaporated to dryness. 87.5 g (100% of theory) thioxanthone-1-carboxylic acid chloride are obtained. 11 g (0.04 mol) of thioxanthone-1-carboxylic acid chloride and 10.4 g (0.08 mol) of 2-hydroxyethyl methacrylate in 170 ml of dioxane are heated at 80° C. for 3 hours and the mixture is then evaporated to dryness. The solid residue is stirred with 100 ml of water and the pH of the resulting suspension is adjusted to 8 with a 3% sodium bicarbonate solution. The crude product is then extracted with 200 ml of methylene chloride, the extract is dried over solid sodium sulfate and the methylene chloride is evaporated. The residue is dissolved in 100 ml of methanol and the solution is filtered with 4 g of animal charcoal. The product which has crystallised out is dissolved in 1,200 ml of diethyl ether and extracted with 50 ml of 1% sodium hydroxide solution. The ether phase is washed with water and dried over sodium sulfate. The ethereal solution is then stabilised with 0.05% by weight of 2,6-di-tert.-butyl cresol and concentrated. 7.7 g (52% of theory) of β-(methacryloyloxy)-ethyl thioxanthone-1-carboxylate are obtained; melting point 112°–113° C. IR spectrum (chloroform): 1740 $cm^{-1}$ (—COOR); 1660 $cm^{-1}$ (—CO—).

EXAMPLE 4

2.75 g (10 mmols) of N-[β-(methacryloyloxy)-ethyl]-dimethylmaleimide (I), 1.0 g (7 mmols) of n-butyl methacrylate and 0.25 g (0.68 mmol) of β-(methacryloyloxy)-ethyl thioxanthone-1-carboxylate (II), 1.0 g (11.6 mmols) of methacrylic acid, 0.025 g of azoisobutyronitrile and 0.050 g of dodecyl mercaptan are dissolved in 20 g of toluene in a 100 ml sulfonation flask, which is fitted with a reflux condenser, a nitrogen inlet and a stirrer. The mixture is polymerized in yellow light at 70° C. for 24 hours. The polymer which has precipitated (polymer No. 4) is filtered off and dried under a high vacuum. Composition of the polymer: 34.15 mol% of (I) and 2.32 mol% of (II). $\eta_{int}$=0.22 dl/g in $CHCl_3$ at 20° C.

EXAMPLE 5

2.25 g (9.5 mmols) of N-[β-(methacryloyloxy)-ethyl]-dimethylmaleimide (I), 1.0 g (7 mmols) of n-butyl methacrylate, 0.75 g (2.04 mmols) of β-(methacryloyloxy)-ethyl thioxanthone-1-carboxylate (II), 1.0 g (11.6 mmols) of methacrylic acid, 0.025 g of azoisobutyronitrile and 0.050 g of dodecyl mercaptan are polymerised in the manner described in Example 4 (polymer No. 5). Composition of the polymer: 21.52 mol% of (I) and 6.77 mol% of (II). $\eta_{int}$=0.18 dl/g in $CHCl_3$ at 20° C.

EXAMPLE 6

1.8 g (7.6 mmols) of N-[β-(methacryloyloxy)-ethyl]-dimethylmaleimide (I), 1.0 g (7 mols) of n-butyl methacrylate, 1.2 g (3.26 mols) of β-(methacryloyloxy)-ethyl thioxanthone-1-carboxylate (II), 1.0 g (11.6 mmols) of methacrylic acid, 0.025 g of azoisobutyronitrile and 0.050 g of dodecyl mercaptan are polymerised in the manner described in Example 4 (polymer No. 6). Composition of the polymer: 25.8 mol% of (I) and 11.06 mol% of (II). $\eta_{int}=0.19$ dl/g in $CHCl_3$ at 20° C.

EXAMPLE 7

2 g of a copolymer of maleic anhydride and methyl vinyl ether (molar ratio 1:1, mean molecular weight about 740,000) are dissolved, together with 0.6 g (0.002 mol) of β-hydroxyethyl thioxanthone-1-carboxylate, in 20 ml of absolute tetrahydrofuran. 1.08 g of N-(β-hydroxyethyl)-dimethyl-maleimide [prepared in accordance with German Offenlegungsschrift No. 2,626,795] and 0.06 ml of dry pyridine are added to this solution. The solution is refluxed for 72 hours with the exclusion of light. It is then cooled to room temperature and the reaction mixture is precipitated in one liter of dilute hydrochloric acid. After drying, 3 g of a slightly yellowish polymer are obtained (polymer No. 7). $\eta_{int}=0.37$ dl/g in $CHCl_3$ at 20° C.

EXAMPLE 8

2 g of a copolymer of ethylene and maleic anhydride (molar ratio 1:1, mean molecular weight about 20,000) are dissolved, together with 0.75 g (0.0024 mol) of β-hydroxyethyl thioxanthone-1-carboxylate, in 20 ml of absolute tetrahydrofuran. 1.352 g of N-(β-hydroxyethyl)-dimethylmaleimide and 0.06 ml of dry pyridine are added to this solution. The solution is refluxed for 72 hours with the exclusion of light. It is then cooled to room temperature and the reaction mixture is precipitated in 1 liter of dilute hydrochloric acid. After drying, 3.2 g of a yellowish polymer are obtained (polymer No. 8); $\eta_{int}=0.31$ dl/g in $CHCl_3$ at 20° C. The β-hydroxyethyl thioxanthone-1-carboxylate used in the above Examples 7 and 8 can be prepared as follows: 18.4 g (0.06 mol) of the sodium salt of thioxanthone-1-carboxylic acid [prepared by reacting thioxanthone-1-carboxylic acid with NaOH], 14.5 g (0.18 mol) of ethylene-chlorohydrin and 0.18 g of diethylamine are refluxed at 130° C. for 4 hours. After cooling the reaction mixture, this is twice evaporated with, in each case, 100 ml of dioxane. The residue is recrystallised from 1,000 ml of methanol with the addition of animal charcoal. 13.2 g of β-hydroxyethyl thioxanthone-1-carboxylate are obtained; melting point 169° C. IR spectrum (chloroform): 1750 $cm^{-1}$ (—COOR); 1660 $cm^{-1}$ (—CO—).

EXAMPLE 9

3.44 g of a polymer consisting of 50 mol% of N-[β-(methacryloyloxy)-ethyl]dimethylmaleimide, 25 mol% of n-butyl methacrylate and 25 mol% of maleic acid are dissolved, with 3.12 g (0.1 mol) of glycidyl thioxanthone-1-carboxylate and 0.1 g of tetraethylammonium bromide, in 69 ml of cyclohexane in a 100 ml three-necked flask, and the solution is stirred for 2 hours at 110° C. Using the cooled solution, copper sheets are so coated, by whirler-coating (500 revolutions/minute), that, after drying, a 1–3μ thick coating of polymer is formed on the copper. The coated sheets are exposed through a negative original (step wedge, Stauffer 21-step sensitivity guide) using a 400 Watt high-pressure mercury discharge lamp at a distance of 60 cm from the vacuum table. After exposure, the image is developed for 2 minutes in a 1,1,1-trichloroethane bath, by which means the portions which have not been crosslinked are dissolved out. The resulting relief image of the recorded step wedge is rendered visible by etching the copper portions with a 50% $FeCl_3$ solution. Last step recorded after:

12 minutes step 8
6 minutes step 5
3 minutes step 4
1 minute step 2.

The glycidyl thioxanthone-1-carboxylate used in the above example can be prepared as follows: 8.34 g (0.03 mol) of the sodium salt of thioxanthone-1-carboxylic acid and 0.1 ml of triethylamine are heated in 15 ml of epichlorohydrin at 130° C. until a dark, homogeneous solution has formed, and the solution is then kept at this temperature for 3 hours. The reaction mixture is then diluted with 50 ml of dioxane, heated to reflux and cooled, and the sodium chloride which has precipitated out is filtered off with suction. The solvent is evaporated and the residue is stirred with 15 ml of diethyl ether. The crude product which has crystallised out is filtered off with suction. Both the product which has crystallised out and the mother liquor are purified through a silica gel column (solvent system chloroform/acetone in a volume ratio of 19:1). The products obtained after chromatography are recrystallised from methanol. 7.54 g of glycidyl 1-thioxanthone-1-carboxylate are obtained; melting point 115°–117° C. IR spectrum (chloroform): 1750 $cm^{-1}$ (—COOR); 1660 $cm^{-1}$ (—CO—). UV spectrum: $\lambda_{max.}=385$ nm, $\epsilon=6600$.

B. USE EXAMPLES (PRODUCTION OF IMAGES).

EXAMPLE I

The polymers according to Examples 1–3 are each used to prepare the polymer solution, diluted to a solids content of 13% by weight, in 1-acetoxy-2-ethoxyethane. Using these polymer solutions, copper sheets are so coated, by whirler-coating (500 revolutions/minute for 1 minute), that, after drying, a 1–3μ thick coating of polymer is formed on the copper. The coated sheets are exposed through a negative original (step wedge, Stauffer 21-step sensitivity guide) using a 400 Watt high-pressure mercury discharge lamp at a distance of 50 cm from the vacuum table. After exposure, the image is developed for 2 minutes in a 1,1,1-trichloroethane bath, by which means the portions which have not been crosslinked are dissolved out. The resulting relief image of the recorded step wedge is rendered visible by etching the exposed parts of the copper with a 50% $FeCl_3$ solution.

The results are summarised in Table I below.

TABLE I

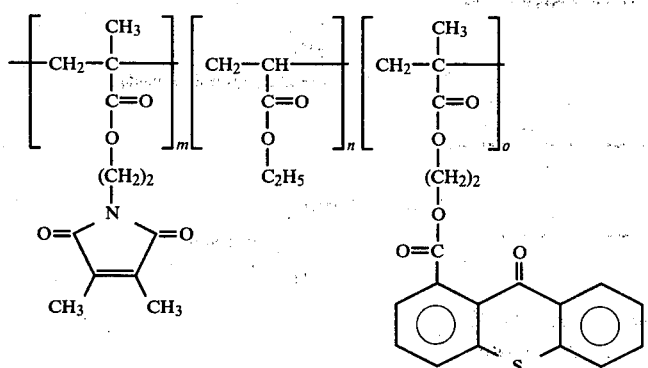

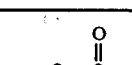

| Polymer No. | Molecular weight | Polymer composition m/(n+m+o) | n/(n+m+o) | o/(n+m+o) |
|---|---|---|---|---|
| 1 | 620,000 | 0.7856 | 0.196 | 0.01836 |
| 2 | 780,000 | 0.7927 | 0.198 | 0.0092 |
| 3 | 620,000 | 0.7981 | 0.1988 | 0.0031 |

Sensitiser

| Polymer No. | Sensitiser concentration % by weight | mols | Photosensitivity of the final step recorded after 20" | 30" | 1' | 3' | 6' |
|---|---|---|---|---|---|---|---|
| 1 | 2.7 | $7.33 \cdot 10^{-3}$ | 2 | 3 | 5 | 8 | 10 |
| 2 | 1.38 | $3.75 \cdot 10^{-3}$ |  | 3 | 6 | 8 |  |
| 3 | 0.46 | $1.25 \cdot 10^{-3}$ |  | 0 | 2 | 4 |  |

EXAMPLE II 1 g of each of the polymers prepared according to Examples 7 and 8 is dissolved in 9 ml of N,N-dimethylformamide. The resulting solution is so applied, by whirler-coating, to an approximately 0.5 mm thick copper-coated support that, after drying, an approximately 3μ thick polymer film is obtained on the support. A photographic plate prepared in this way is irradiated through a negative original (step wedge, Stauffer 21-step sensitivity guide) for various lengths of time using a 400 Watt high-pressure mercury discharge lamp at a distance of 60 cm from the vacuum table. The exposed plate is developed in 5% $NaHCO_3$ solution and the final step recorded is rendered more easily visible by etching the exposed parts of the copper with $FeCl_3$.

| Polymer No. | Final step recorded after seconds 10" | 30" | minutes 1' | 3' | 6' | 12' |
|---|---|---|---|---|---|---|
| 7 | 1 | 3 | 5 | 8 | 10 | 12 |
| 8 |  |  |  | 3 | 5 | 7 |

EXAMPLE III: PHOTOGRAPHIC RECORDING MATERIAL

Using a 25 μm hand doctor under yellow light, light-sensitive polymer coatings of 15% polymer solutions in methyl ethyl ketone/methylcellosolve (volume ratio 1:1) are applied to transparent 100 μm thick polyester carrier films. The polymers used are the compounds according to Examples 4–6. The coatings are dried for 3 minutes at 100° C. A homogeneous, transparent, slightly yellowish coloured coating is obtained which has a thickness of 3 μm. The films prepared in this way are exposed, in contact with an offset text wedge and through the latter for 5–20 seconds on a copying apparatus (Oce Helioprint 36, 1,000 Watt metal-halogen lamp, at a distance of 53 cm). The exposed strips are dipped for 15 seconds into 2% $Na_2CO_3$. The strips are then washed for 5 seconds in running or deionised water and dipped for 30–45 seconds in a 3% aqueous solution of the dye of the formula

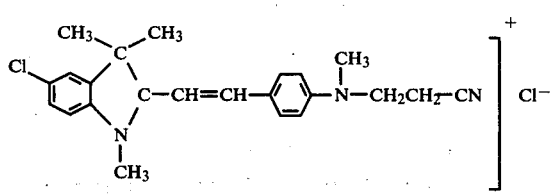

The strips are then rinsed with water for 30 seconds and dried.

The number of steps of the text wedge which are reported are a measure of the sensitivity to light of the films. The results are summarised in Table II below:

TABLE II

| Polymer according to Example No. | Concentration of the copolymerised thioxanthone (% by weight) | Exposure time (seconds) | Number of steps recorded |
|---|---|---|---|
| 4 | 5 | 5 | 4 |
|  |  | 10 | 6 |
|  |  | 20 | 7 |
| 5 | 15 | 5 | 5 |
|  |  | 10 | 7 |
|  |  | 20 | 8 |

TABLE II-continued

| Polymer according to Example No. | Concentration of the copolymerised thioxanthone (% by weight) | Exposure time (seconds) | Number of steps recorded |
|---|---|---|---|
| 6 | 24 | 5 | 6 |
|  |  | 10 | 7 |
|  |  | 20 | 9 |

What is claimed is:

1. A polymer having a mean molecular weight of about 10,000 to 1,000,000 as measured by intrinsic viscosity in chloroform at 20° C. and containing recurring structural elements of at least one of the formulae IIIa to XIa

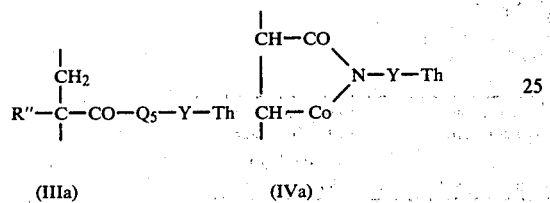

(IIIa)        (IVa)

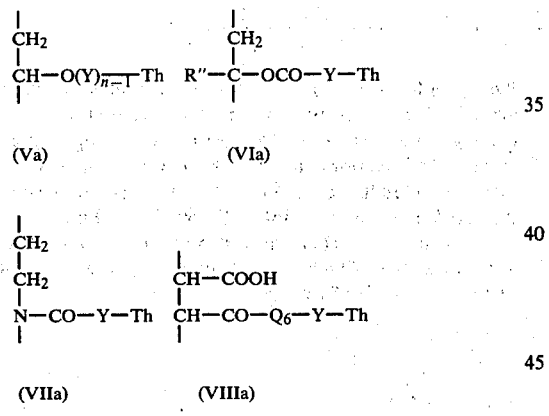

(Va)        (VIa)

(VIIa)       (VIIIa)

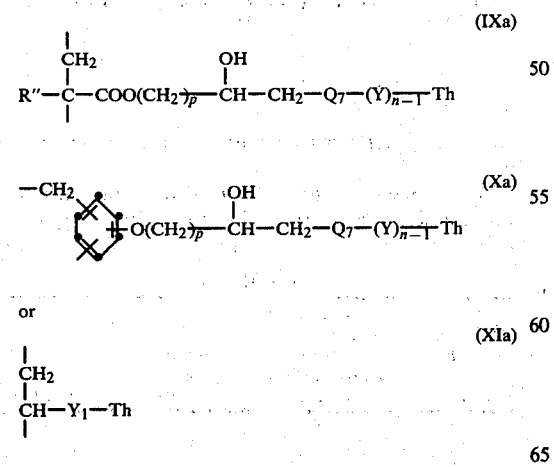

(IXa)

(Xa)

or (XIa)

and recurring structural elements of at least one of the formulae IIIb to XIIIb.

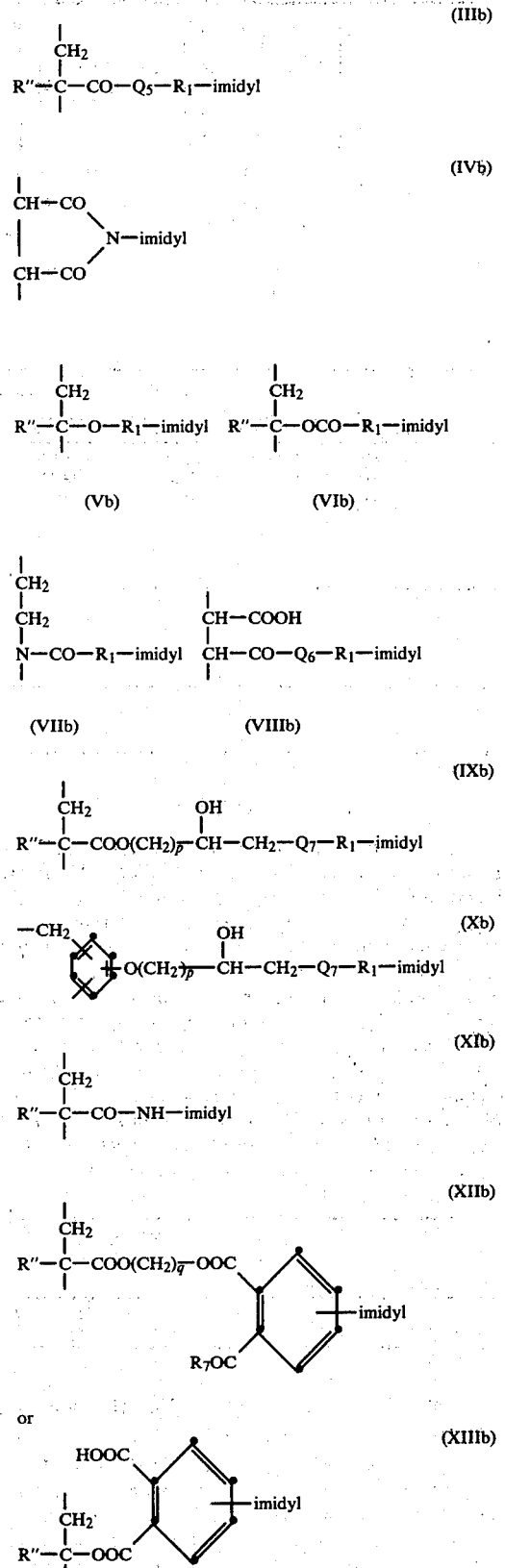

in which formulae Th is a radical of the formula I'

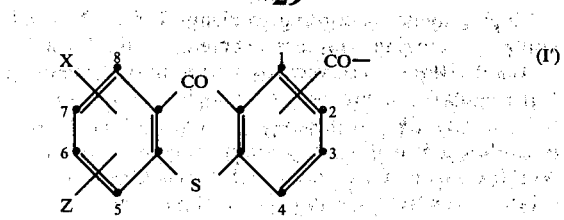 (I')

and imidyl is a radical of the formula (II)

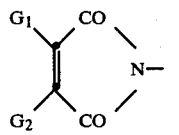 (II)

in which $G_1$ and $G_2$ independently of one another are alkyl having 1–4 C atoms or together are unsubstituted or methyl-substituted trimethylene or tetramethylene; n is the number 1 or 2; X is hydrogen, halogen, —CN, —NO$_2$, phenylsulfonyl or alkylsulfonyl, alkyl, alkoxy, alkylthio, N,N-dialkylamino or —CO—alkyl having, in each case, 1–4 C atoms in the alkyl moieties; Z is hydrogen, halogen or alkyl, alkoxy, alkylthio or N,N-dialkylamino having, in each case, 1–4 C atoms in the alkyl moieties; Y is —OR$_1$—, —SR$_1$— or —N(R$_2$)R$_1$—, and the hetero-atom of the radical Y is bonded to the —CO— group; R$_1$ is straight-chain or branched alkylene having a total of 2–23 C atoms or 2–13 C atoms in the main chain, cyclopentylene, cyclohexylene, phenylene or —(CH$_2$CH$_2$O)$_x$—CH$_2$CH$_2$—;

R$_2$ is hydrogen or straight-chain or branched alkyl having a total of 1–23 C atoms and 1–13 C atoms in the main chain; x is an integer from 1 to 5; Q$_5$ is —OCO—, —O—, —NH—; Q$_6$ is —O—, —S—, —NH— or —N(R')—, Q$_7$ is —OCO—, —O—, —S—, —NH— or —N(R')—; R' is alkyl having 1–5 C atoms; R'' is hydrogen or methyl; R$_7$ is —OH or —O$^-$M$^+$; M$^+$ is an alkali metal, pyridinium or trialkylammonium cation having 3–24 C atoms; p is the number 1 or 2; q is an integer from 2 to 4; Y$_1$ is —OR$_1$'—, —SR$_1$'— or —NHR$_1$'—, the hetero-atom of the radical Y$_1$ being bonded to the —CO group; and R$_1$' is straight-chain or branched alkylene having a total of 2–23 C atoms and 2–13 C atoms in the main chain, or phenylene; the proportion of groupings of the formula I' being 0.1 to 50 percent and the proportion of groupings of the formula II being 5–99.9 percent, based on the number of recurring structural elements in the polymer.

2. A polymer according to claim 1, in which the proportion of groupings of the formula I' is 0.1 to 30 percent and the proportion of groupings of the formula II is 10 to 99.9 percent, based on the number of recurring structural elements in the polymer.

3. A polymer according to claim 1, in which the proportion of groupings of the formula I' is 0.1 to 10 percent and the proportion of groupings of the formula II is 30 to 99.9 percent, based on the number of recurring structural elements in the polymer.

4. A polymer according to claim 1, which contains recurring structural elements of at least one of the formulae IIIa, Va, VIa, VIIIa or XIa and at least one of the formulae IIIb, Vb, VIb or VIIIb in which R'' is hydrogen or methyl, Q$_5$ is —O—, Q$_6$ is —O— or —NH—, n is the number 1 or 2, Y is —OR$_1$— or —NHR$_1$—, the hetero-atom of the radical Y being bonded to the —CO group, R$_1$ is alkylene having 2–6 C atoms, X is hydrogen, Z is hydrogen, methyl or methoxy bonded in the 7-position, and the carbonyl group in formula I' is bonded in the 1-position or 3-position to the benzene ring.

5. A polymer according to claim 1, in which G$_1$ and G$_2$ are each methyl, Z is hydrogen, and the grouping —CO— in formula I' is in the 1-position or 3-position.

6. A polymer according to claim 1, in which G$_1$ and G$_2$ are each methyl, X is hydrogen, Z is hydrogen or methyl or methoxy bonded in the 7-position, the group —CO— in formula I' is in the 1-position or 3-position, Y is —OR$_1$— or —NHR$_1$—, and R$_1$ is alkylene having 2–6 C atoms.

7. A polymer according to claim 1, which consists of recurring structural elements of at least one of the formulae IIIa to XIa and at least one of the formulae IIIb to XIIIb and also of recurring structural elements of the formula XIV

 (XIV)

in which X$_6$ is hydrogen, X$_5$ is hydrogen, chlorine or methyl and X$_7$ is hydrogen, methyl, chlorine, —CN, —COOH, —CONH$_2$, phenyl, methylphenyl, methoxyphenyl, cyclohexyl, pyridyl, imidazolyl, pyrrolidyl, —COO—alkyl having 1–12 C atoms in the alkyl moiety, —COO—phenyl,

—COO—alkylene—OH having 1–3 C atoms in the alkylene moiety, —OCO—alkyl having 1–4 C atoms in the alkyl moiety, —OCO— phenyl, —CO—alkyl having 1–3 C atoms in the alkyl, alkoxy having 1–20 C atoms or phenoxy, or X$_5$ is hydrogen and X$_6$ and X$_7$ together are the grouping

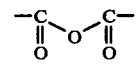

or are each —COOH or —COO—alkyl having 1–6 C atoms in the alkyl.

8. A polymer according to claim 4, which contains recurring structural elements of at least one of the formulae IIIa or VIIIa and at least one of the formulae IIIb or VIIIb.

9. A polymer according to claim 7, which contains recurring structural elements of at least one of the formulae IIIa, Va, VIa, VIIIa or XIa and at least one of the formulae IIIb, Vb, VIb or VIIIb and at least one of the formula XIV, in which R'' is hydrogen or methyl, Q$_5$ is —O—, Q$_6$ is —O— or —NH—, n is the number 1 or 2, Y is —OR$_1$—, or —NHR$_1$—, the hetero-atom of the radical Y being bonded to the —CO group, R$_1$ is alkylene having 2–6 atoms, X is hydrogen, Z is hydrogen or methyl or methoxy bonded in the 7-position, X$_6$ is hydrogen, X$_5$ is hydrogen or methyl and X$_7$ is —OCOCH$_3$, —COOH or —COO-alkyl having 1–8 C atoms in the alkyl, or $X_5$ and $X_6$ are each hydrogen and $X_7$ is —CN, chlorine, phenyl or alkoxy having 1–6 C atoms in the alkyl moiety, and the carbonyl group in formula I' is bonded in the 1-position or 3-position to the benzene ring.

10. A polymer according to claims 7, 8 or 9, which contains recurring structural elements of the formulae IIIa and IIIb and also recurring structural elements of the formula XIV, in which R" is methyl, $Q_5$ is —O—, Y is —O—$CH_2CH_2$—, the oxygen atom of the radical Y being bonded to the —CO group, $R_1$ is —$CH_2CH_2$—, $X_5$ and $X_6$ are each hydrogen and $X_7$ is —COO—$CH_2CH_3$, the radical Th is the group

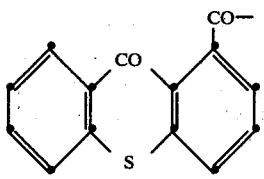

and the radical imidyl is the group

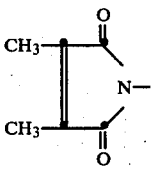

11. A polymer according to claims 7, 8 or 9, which contains recurring structural elements of the formulae IIIa and IIIb and also recurring structural elements of the formula XIV, in which R" is methyl, $Q_5$ is —O—, Y is —O—$CH_2CH_2$—, the oxygen atom of the radical Y being bonded to the —CO group, $R_1$ is —$CH_2CH_2$—, $X_5$ is hydrogen, $X_6$ is methyl and $X_7$ is —COO—n—butyl or —COOH, the radical Th is the group

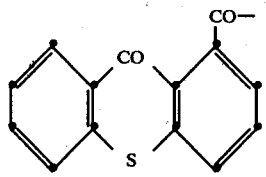

and the radical imidyl is the group

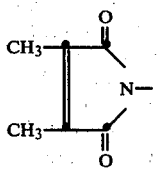

12. A polymer according to claim 9, which contains recurring structural elements of at least one of the formulae IIIa or VIIIa and at least one of the formulae IIIb or VIIIb.

* * * * *